US008643992B2

(12) United States Patent
Ohshima

(10) Patent No.: US 8,643,992 B2
(45) Date of Patent: Feb. 4, 2014

(54) OVERCURRENT PROTECTION APPARATUS FOR LOAD CIRCUIT

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 467 days.

(21) Appl. No.: 12/996,027

(22) PCT Filed: Jun. 5, 2009

(86) PCT No.: PCT/JP2009/060378
§ 371 (c)(1),
(2), (4) Date: Dec. 3, 2010

(87) PCT Pub. No.: WO2009/148161
PCT Pub. Date: Dec. 10, 2009

(65) Prior Publication Data
US 2011/0085275 A1    Apr. 14, 2011

(30) Foreign Application Priority Data
Jun. 5, 2008  (JP) .................................. 2008-148344

(51) Int. Cl.
*H02H 9/02* (2006.01)
(52) U.S. Cl.
USPC ........................................ 361/93.1; 361/93.7
(58) Field of Classification Search
None
See application file for complete search history.

(56) References Cited

U.S. PATENT DOCUMENTS

| 2004/0207967 A1 | 10/2004 | Ohshima |
| 2006/0158817 A1 | 7/2006 | Oshima |
| 2006/0187604 A1* | 8/2006 | Ohshima ...................... 361/100 |

FOREIGN PATENT DOCUMENTS

| JP | 2000-235424 A | 8/2000 |
| JP | 2002-353794 A | 12/2002 |
| JP | 2006-197768 A | 7/2006 |
| JP | 2006-229864 A | 8/2006 |

OTHER PUBLICATIONS

Office Action, dated Sep. 25, 2012, issued by the Japanese Patent Office in counterpart Japanese Application No. 2008-148344.
International Search Report [PCT/ISA/210] issued in PCT/JP2009/060378 dated Jul. 7, 2010 ; 3 pages.

* cited by examiner

*Primary Examiner* — Rexford Barnie
*Assistant Examiner* — Angela Brooks
(74) *Attorney, Agent, or Firm* — Sughrue Mion, PLLC

(57) ABSTRACT

An overcurrent protection apparatus for a load circuit can detect an overcurrent with a high accuracy without being influenced by a deviation ±ΔRon of the on-resistance of a semiconductor element (T1). Supposing that a ratio (R3/R1) between a resistor R3 and a resistor R1 is an amplification factor m, a determination voltage generated by resistors R4, R5 is V4 and the average value of the on-resistance of a MOSFET (T1) is Ron, the overcurrent protection apparatus for a load circuit controls either a current I3 flowing through the resistor R3 or a current IR5 flowing through the resister R5 so that the output signal of a compactor CMP1 is inverted when a current having a value of (V4/m/Ron) flows into the MOSFET (T1).

9 Claims, 3 Drawing Sheets

OVERCURRENT PROTECTION APPARATUS FOR LOAD CIRCUIT

TECHNICAL FIELD

The present invention relates to an overcurrent protection apparatus which detects an overcurrent, when the overcurrent flows through a load circuit, and protects the load circuit and, in particular, relates to a technique of avoiding the deterioration of detection accuracy due to the deviation (variance) of an on-resistance of a semiconductor element

BACKGROUND ART

For example, loads such as various kinds of lamps, motors etc. mounted on a vehicle are coupled to a battery (power source) via semiconductor elements, whereby the operations of the loads are controlled by switching the on/off states of the corresponding semiconductor elements, respectively. An overcurrent may flow into a load circuit configured by such the battery, semiconductor elements and loads due to a trouble or an operational failure etc. of the load circuit or various kinds of circuits coupled to the load circuit. When the overcurrent flows, there arises a problem that the semiconductor elements are overheated and harness wires coupling between the loads and the power source are also overheated. Thus, various kinds of overcurrent protection apparatuses have been proposed each of which is arranged to immediately detect an overcurrent when the overcurrent is generated to thereby interrupt a current flowing into a load circuit.

FIG. 3 is a circuit diagram showing the configuration of a load circuit provided with an overcurrent protection apparatus of the related art. As shown in FIG. 3, the load circuit includes a series circuit formed by a battery VB, a MOSFET (T101) as a semiconductor element, and a load RL such as a lamp or a motor. The gate of the MOSFET (T101) is coupled to a driver circuit 101 via a resistor R110. Thus, the MOSFET (T101) is turned on and off in response to a drive signal outputted from the driver circuit 101 to thereby switch the load RL between a driving state and a stop state.

The drain of the MOSFET (T101) is coupled to a ground via a series circuit of resistors R104 and R105 and also coupled to the ground via a series circuit of a resistor R101, a transistor T102 and a resistor R103. A coupling point between the transistor T102 and the resistor R101 is coupled to the inverting input terminal of an amplifier AMP101 and the non-inverting input terminal of the amplifier AMP101 is coupled to the source of the MOSFET (T101). Further, the output terminal of the amplifier AMP101 is coupled to the gate of the transistor T102.

Further, a coupling point (voltage V3) between the transistor (T102) and the resistor R103 is coupled to the inverting input terminal of a comparator CMP101 and a coupling point (voltage V4) between the resistors R104 and R105 is coupled to the non-inverting input terminal of the comparator CMP101.

When the MOSFET (T101) is turned on and a current ID flows into the load circuit, a current I1 flows into the series circuit of the resistor R101, transistor T102 and resistor R103. In this case, the amplifier AMP101 controls the current I1 flowing into the transistor T102 so that the drain-source voltage Vds of the MOSFET (T101) becomes same as a voltage generated across the both ends of the resistor R101.

Thus, the voltage V3 generated at the resistor R103 becomes a value obtained by multiplying the voltage Vds by m (m=R103/R101). The amplified voltage V3 is inputted to the inverting input terminal of the comparator CMP101. The voltage V4 obtained by dividing a voltage V1 by the resistors R104 and R105 is inputted to the non-inverting input terminal of the comparator CMP101 as an overcurrent determination voltage. When the load current ID becomes an overcurrent state, the voltage Vds becomes large and so the voltage V3 becomes larger than the voltage V4. Thus, since the output state of the comparator CMP101 is inverted, the overcurrent state is detected.

Supposing that the drain voltage of the MOSFET (T101) is V1, the source voltage thereof is V2, the on-resistance thereof is Ron and the deviation of the on-resistance is ±ΔRon, the voltage Vds is represented by the following expression (1).

$$Vds = V1 - V2 = (Ron \pm \Delta Ron) * ID \quad (1)$$

Thus, the voltage V3 is represented by the following expression (2).

$$V3 = R103 * I1 \quad (2)$$
$$= (R103/R101) * R101 * I1$$
$$= m * ID(Ron \pm \Delta Ron)$$

Thus, since the voltage V3 contains a voltage obtained by multiplying (±ΔRon*ID) by m, this voltage causes the variance of a load current detection value.

Supposing that a value of the load current ID detected as an overcurrent is Iovc (hereinafter called as an "overcurrent detection value"), the following expression (3) is obtained.

$$V3 = m*(Ron*Iovc \pm \Delta Ron*Iovc) = V4 \quad (3)$$

When the expression (3) is rewritten, the following expression (4) is obtained.

$$Iovc = V4/m/Ron \pm \Delta Ron/Ron*Iovc \quad (4)$$

When the deviation ±ΔRon is not contained in the on-resistance Ron of the MOSFET (T101) (that is, ΔRon=0), the overcurrent detection value Iovc becomes a constant value determined by the voltage V4, resistor R101, resistor R103 and on-resistance Ron. However, when the on-resistance Ron of the MOSFET (T101) contains the deviation ±ΔRon, the overcurrent detection value Iovc varies and the variance value becomes "±ΔRon/Ron*Iovc". The variance due to the deviation ΔRon is proportional to the overcurrent detection value Iovc.

In general, the value of ΔRon/Ron reaches in a range from 0.2 to 0.3, which largely degrades the detection accuracy when the voltage Vds is regarded as a current sensor. Thus, there has been increasing a demand of avoiding the influence of the deviation ΔRon by any means.

Further, in the case of changing the kind of the semiconductor element (MOSFET in the case of FIG. 3), since the on-resistance of the semiconductor element changes, it is necessary to change the determination voltage V4 in order to obtain a target overcurrent detection value Iovc. Thus, in the case of forming a circuit for controlling the semiconductor element as an integrated circuit, it becomes necessary not to dispose the resistors R104, R105 used for setting the determination voltage V4 within an integrated circuit but to dispose outside of the IC. As a result, the IC requires dedicated terminals for coupling with the resistors R104, R105, which results in the increase of an occupation space and cost-up.

Further, for example, JP-A-2002-353794 (patent document 1) is known as an example of the related arts which detects an overcurrent by avoiding the influence of the deviation ±ΔRon of the on-resistance Ron of the MOSFET (T101).

The technique described in the patent document 1 relates to an overcurrent protection apparatus which intends to surely interrupt a circuit at the time of occurrence of a dead short-circuit but does not intend to surely detect a current of an overcurrent determination value Iovc when the current flows into the load RL.

PRIOR ART DOCUMENT

Patent Document

Patent Document 1: JP-A-2002-353794

SUMMARY OF THE INVENTION

Problems that the Invention is to Solve

As described above, the overcurrent protection apparatus for a load circuit of the related art has the problem that, when there is the deviation ±ΔRon in the on-resistance Ron of the semiconductor element (MOSFET), the overcurrent determination value Iovc is influenced by the deviation and so the circuit can not be interrupted based on the accurate overcurrent determination value Iovc.

The invention is made in order to solve such the problem of the related art and an object of the invention is to provide an overcurrent protection apparatus for a load circuit which can avoid the influence of the deviation ±ΔRon of the on-resistance Ron of a semiconductor element on the detection of an overcurrent and so can interrupt the load circuit in accordance with an accurate overcurrent determination value I ovc, and further can dispose an overcurrent determination voltage circuit within an IC by providing a correction means for an overcurrent determination voltage.

Means for Solving the Problems (1) In order to attain the above object, the overcurrent protection apparatus for a load circuit according to the invention is the overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:

an amplifying section (AMP1) that includes a non-inverting terminal which is coupled to the second main electrode of the first semiconductor element (T1);

a first resistor (R1) that includes one end which is coupled to the first main electrode of the first semiconductor element (T1) and the other end which is coupled to an inverting terminal of the amplifying section (AMP1);

a third resistor (R3);

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and a comparator (CMP1) that includes one input terminal and the other input terminal, the one input terminal being applied with a voltage (V3) at a coupling point (point e) between the second semiconductor element (T2) and the third resistor (R3), and the other input terminal being applied with a determination voltage (V4) which is generated by dividing a voltage (V1) of the first main electrode of the first semiconductor element (T1) by a resistance ratio (R4:R5), wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is larger than the average value (Ron) of the on-resistance, a current obtained by subtracting a current (ΔI1) proportional to a deviation (ΔRon) of the on-resistance from a current (I1) flowing through the first resistor at the point a is flown through the third resistor so that an output signal of the comparator (CMP1) is inverted.

(2) In order to attain the above object, the overcurrent protection apparatus for a load circuit according to the invention is the overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:

an amplifying section (AMP1) that includes a non-inverting terminal which is coupled to the second main electrode of the first semiconductor element (T1);

a first resistor (R1) that includes one end which is coupled to the first main electrode of the first semiconductor element (T1) and the other end which is coupled to an inverting terminal of the amplifying section (AMP1);

a third resistor (R3);

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and a comparator (CMP1) that includes one input terminal and the other input terminal, the one input terminal being applied with a voltage (V3) at a coupling point (point e) between the second semiconductor element (T2) and the third resistor (R3), and the other input terminal being applied with a determination voltage (V4) which is generated by dividing a voltage (V1) of the first main electrode of the first semiconductor element (T1) by a resistance ratio (R4:R5), wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is smaller than the average value (Ron) of the on-resistance, a current obtained by adding a current (ΔI1) proportional to the deviation (ΔRon) to a current (I1) flowing through the first resistor at the point a is flown through the third resistor so that an output signal of the comparator (CMP1) is inverted.

(3) The overcurrent protection apparatus for a load circuit according to the above configuration (1), further including:
a seventh resistor (R7) that includes one end which is coupled to the positive electrode terminal (point d) of the power source;
a third semiconductor element (T3) that includes a second main electrode which is coupled to the other end of the seventh resistor (R7) and a control electrode which is coupled to the output terminal of the amplifying section (AMP1); and
a fourth semiconductor element (T4) that includes a first main electrode and a control electrode which are coupled to a first main electrode of the third semiconductor element and a second electrode which is grounded,
wherein when the on-resistance of the first semiconductor element (T1) is larger than the average value of the on-resistance, a current (I4) proportional to a current (ID) flowing into the first semiconductor element is generated, and a current (ΔI1 (=I5)) proportional to the deviation is generated by using the current (I4).

(4) The overcurrent protection apparatus for a load circuit according to the above configuration (2), further including:
a seventh resistor (R7) that includes one end which is coupled to the positive electrode terminal (point d) of the power source;
an eighth resistor (R8) that includes one end which is coupled to the point d;
a third semiconductor element (T3) that includes a second main electrode which is coupled to the other end of the seventh resistor (R7) and a control electrode which is coupled to an output terminal of the amplifying section (AMP1);
a fourth semiconductor element (T4) that includes a first main electrode and a control electrode which are coupled to a first main electrode of the third semiconductor element and a second electrode which is grounded; and
a sixth semiconductor element (T6) that couples the other end of the eighth resistor (R8) and the point a,
wherein when the on-resistance of the first semiconductor element (T1) is smaller than the average value (Ron) of the on-resistance, the sixth semiconductor element (T6) is controlled so as to be turned on, and a current (I1+I6−I5) obtained by adding a current (I6−I5), which is obtained by subtracting a current (I5) proportional to a current (I4) flowing through the fourth semiconductor element (T4) from a current (I6) flowing through the eighth resistor (R8), to the current (I1) flowing through the first resistor is flown into the third resistor.

(5) In order to attain the aforesaid object, the overcurrent protection apparatus for a load circuit according to the invention is the overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:
an amplifying section (AMP1) that includes a non-inverting terminal which is coupled to the second main electrode of the first semiconductor element (T1);
a first resistor (R1) that includes one end which is coupled to the first main electrode of the first semiconductor element (T1) and the other end which is coupled to an inverting terminal of the amplifying section (AMP1);
a third resistor (R3);
a forth resistor (R4) that includes one end which is coupled to a terminal (point d) of the power source;
a fifth resistor (R5) that includes one end which is coupled to the other end of the fourth resistor and the other end which is grounded;
a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and
a comparator (CMP1) that includes one input terminal and the other input terminal, the one input terminal being applied with a voltage (V3) at a coupling point (point e) between the second semiconductor element (T2) and the third resistor (R3), and the other input terminal being applied as a determination voltage with a voltage (V4) at a point f which is a coupling point between the fourth resistor and the fifth resistor,
wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is smaller than the average value (Ron) of the on-resistance, a current (IR4−I10) obtained by subtracting a current (I10) proportional to a deviation (ΔRon) from a current (IR4) flowing through the fourth resistor (R4) at the point f is flown through the fifth resistor (R5) so that an output signal of the comparator (CMP1) is inverted.

(6) In order to attain the aforesaid object, the overcurrent protection apparatus for a load circuit according to the invention is the overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:
an amplifying section (AMP1) that includes a non-inverting terminal which is coupled to the second main electrode of the first semiconductor element (T1);
a first resistor (R1) that includes one end which is coupled to the first main electrode of the first semiconductor element (T1) and the other end which is coupled to an inverting terminal of the amplifying section (AMP1);
a third resistor (R3);
a forth resistor (R4) that includes one end which is coupled to a terminal (point d) of the power source;
a fifth resistor (R5) that includes one end which is coupled to the other end of the fourth resistor and the other end which is grounded;
a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and a comparator (CMP1) that includes one input terminal and the other input terminal, the one input terminal being applied with a voltage (V3) at a coupling point (point e) between the second semiconductor element (T2) and the third resistor (R3), and the other input terminal being applied as a determination voltage with a voltage (V4) at a point f which is a coupling point between the fourth resistor and the fifth resistor, wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is larger than the average value (Ron) of the on-resistance, a current (IR4+I11−I10) obtained by adding a current (I11−I10) proportional to a deviation (ΔRon) to a current flowing through the fourth resistor (R4) at the point f is flown through the fifth resistor (R5) so that an output signal of the comparator (CMP1) is inverted.

(7) The overcurrent protection apparatus for a load circuit according to the above configuration (5), further including:

an eleventh resistor (R11) that includes one end which is coupled to an output terminal (point d) of the power source;

an eighth semiconductor element (T8) that includes a second main electrode which is coupled to the other end of the eleventh resistor (R11) and a control electrode which is coupled to the point f; and a ninth semiconductor element (T9) that includes a first main electrode and a control electrode which are coupled to a first main electrode of the eighth semiconductor element and a second electrode which is grounded, wherein when the on-resistance of the first semiconductor element (T1) is smaller than the average value (Ron) of the on-resistance, a current (I9) proportional to a current (IR4) flowing into the fourth resistor (R4) is generated, and a current (I10) proportional to the deviation (ΔRon) is generated by using the current (I9).

(8) The overcurrent protection apparatus for a load circuit according to the above configuration (6), further including:

an eleventh resistor (R11) that includes one end which is coupled to an output terminal (point d) of the power source;

a twelfth resistor (R12) that includes one end which is coupled to the output terminal (point d) of the power source;

an eighth semiconductor element (T8) that includes a second main electrode which is coupled to the other end of the eleventh resistor (R11) and a control electrode which is coupled to the point f;

a ninth semiconductor element (T9) that includes a first main electrode and a control electrode which are coupled to a first main electrode of the eighth semiconductor element and a second electrode which is grounded; and an eleventh semiconductor element (T11) that couples the other end of the twelfth resistor (R12) and the point f, wherein when the on-resistance of the first semiconductor element (T1) is larger than the average value (Ron) of the on-resistance, the eleventh semiconductor element is controlled so as to be turned on, and the current (I11−I10) is generated by subtracting a current (I10) flowing through the tenth semiconductor element (T10) from a current (I11) flowing through the twelfth resistor (R12).

(9) In order to attain the above object, the overcurrent protection apparatus for a load circuit according to the invention is the overcurrent protection apparatus for protecting a load circuit from an overcurrent, the load circuit being arranged in that a first semiconductor element (T1) is disposed between a power source and a load, a first main electrode of the first semiconductor element (T1) is coupled to a positive electrode terminal of the power source and a second main electrode of the first semiconductor element (T1) is coupled to a negative electrode terminal of the power source via the load, wherein a voltage between the first main electrode and the second main electrode of the first semiconductor element (T1) is compared with a determination voltage to determine whether or not a current flowing through the first semiconductor element (T1) is an overcurrent;

the determination voltage is generated by dividing a voltage between the first main electrode of the first semiconductor element (T1) and a ground by a fourth resistor (R4) and a fifth resistor (R5);

a circuit which detects the voltage between the first main electrode and the second main electrode of the first semiconductor element (T1), a circuit which generates the determination voltage, and a comparator (CMP1) which compares the voltage between the first main electrode and the second main electrode of the first semiconductor element (T1) with the determination voltage are contained in a same integrated circuit; and in a case where an output of the comparator (CMP1) is not inverted when a current to be determined as an overcurrent is flown through the first semiconductor element (T1), the determination voltage is corrected so that the output of the comparator (CMP1) is inverted by increasing or decreasing a current flowing through the fourth resistor (R4) or the fifth resistor (R5) of the determination value circuit.

Effects of the Invention

According to the invention having the aforesaid configuration (1) or (2), when there is the deviation ±ΔRon with respect to the average value Ron of the on-resistance of the first semiconductor element (T1), the variance of the overcurrent detection value due to the presence of the deviation ±ΔRon is corrected in a manner that the change value ΔI1 caused by the deviation ±ΔRon is generated and the change value ΔI1 is subtracted from or added to the current I1 flowing through the first resistor (R1). Thus, the circuit can be interrupted by detecting the overcurrent flowing into the load circuit with a high accuracy. As a result, since it is not necessary to set the electric wire to have a large diameter in view of the flowing of the overcurrent, the diameter of the electric wire used for the load circuit can be made small.

According to the invention having the aforesaid configuration (3) or (4), when the deviation ±ΔRon has a positive value, the current I4 proportional to the load current ID is generated, then the current I5 corresponding to the change amount ΔI1 is generated by using the current I4 and the current I5 is subtracted from the current I1. On the other hand, when the deviation ±ΔRon has a negative value, the current I1+I6 is generated by flowing the current I6 through the eighth resistor (R8) and further the current I5 is subtracted therefrom to thereby substantially add the change amount ΔI1 to the current I1. Thus, the current can be controlled with a high accuracy.

According to the invention having the aforesaid configuration (5) or (6), the determination voltage V4 generated at the coupling point between the fourth resistor (R4) and the fifth resistor (R5) is changed by setting the current flowing through the fifth resistor (R5) to be variable. Thus, when it is necessary to change the determination voltage V4 due to the change of the on-resistance of the semiconductor element (T1), the determination voltage V4 can be changed to a desired value by adjusting the current flowing through the resistor R5. In other words, when the on-resistance of the semiconductor element (T1) changes toward small values, the current I10 is withdrawn from the point f to reduce the current flowing through the fifth resistor (R5), whereby the determination voltage V4 can be reduced. In contrast, when the on-resistance of the semiconductor element (T1) changes toward large values, the current I11−I10 is added to the point f to increase the current flowing through the fifth resistor (R5), whereby the determination voltage V4 can be increased. Thus, the overcurrent flowing into the load can be detected with a high accuracy. Further, since the fourth resistor (R4) and the fifth resistor (R5) necessary for generating the determination voltage V4 can be incorporated into an IC, the miniaturization and the cost reduction of the apparatus can be realized.

According to the invention having the aforesaid configuration (7) or (8), in the case where the on-resistance of the first semiconductor element is smaller than the average value (Ron), in order to generate the current I10 proportional to the deviation (ΔRon) at this time, the current I9 proportional to the load current ID is generated and the current I10 is generated by using the current I9. Then, the current I10 is subtracted from the current IR4 flowing through the fourth resistor (R4). On the other hand, in the case where the on-resistance of the first semiconductor element is larger than the average value (Ron), the current I11 is added to the current IR4 and the current I10 is subtracted therefrom, whereby substantially a desired current (I11−I10) is added to the current IR4. Thus, even when the on-resistance of the semiconductor element changes, the current control can be performed with a high accuracy.

According to the invention having the aforesaid configuration (9), the circuit which detects the voltage between the first main electrode and the second main electrode of the first semiconductor element (T1), the circuit which generates the determination voltage, and the comparator (CMP1) which compares the voltage between the first main electrode and the second main electrode of the first semiconductor element (T1) with the determination voltage are contained in the same integrated circuit. Further, in a case where the output of the comparator (CMP1) is not inverted when a current to be determined as an overcurrent is flown through the first semiconductor element (T1), the current flowing through the fourth resistor or the fifth resistor is adjusted so that the output of the comparator (CMP1) is inverted. Thus, even in the case where the on-resistance Ron has a deviation, the overcurrent of the load circuit can be surely detected without being influenced by the deviation.

MODE FOR CARRYING OUT THE INVENTION

Figure 1:
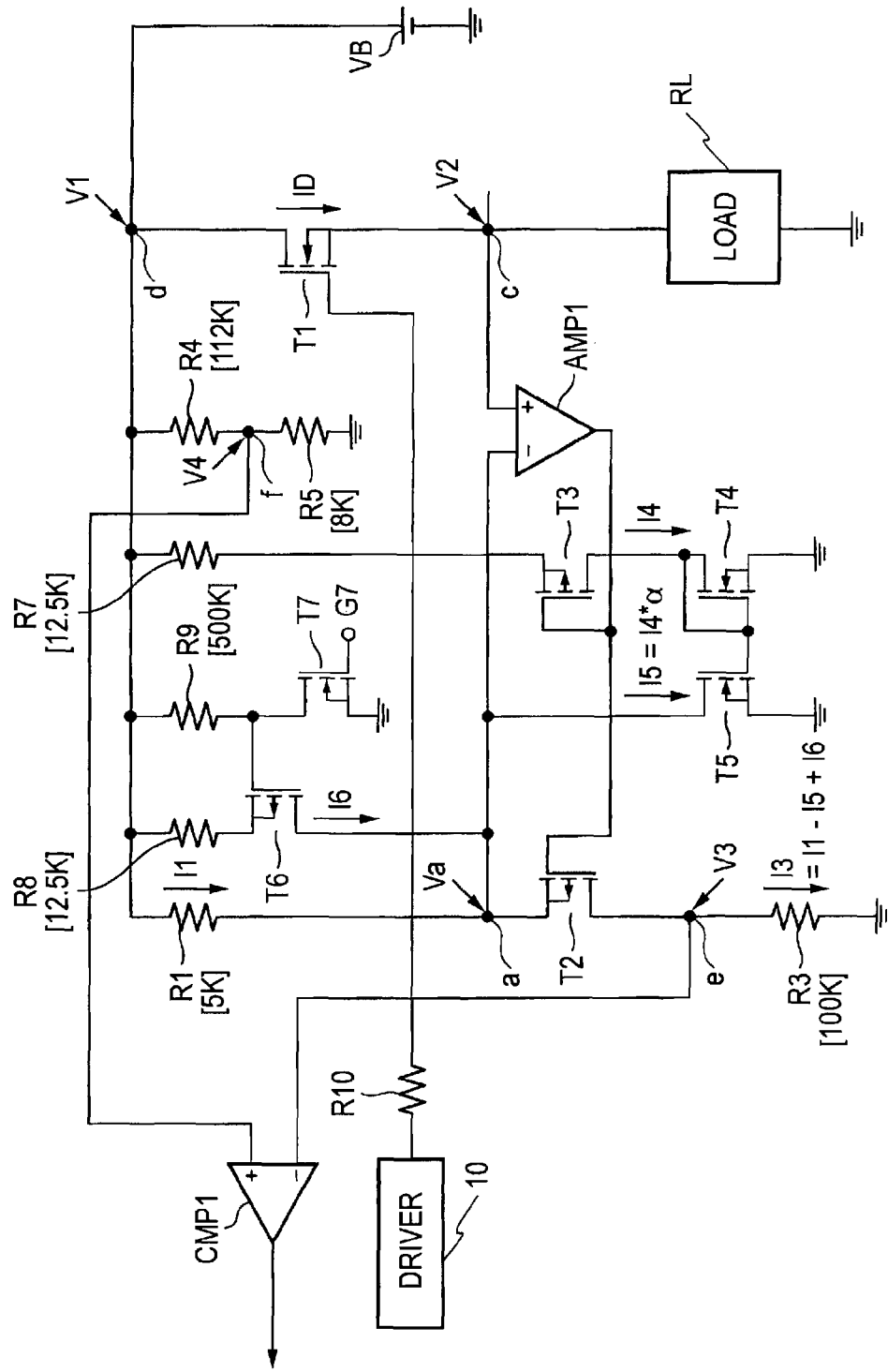
FIG. 1 is a circuit diagram showing an overcurrent protection apparatus and a load circuit according to the first embodiment of the invention.

Hereinafter, embodiments according to the invention will be explained with reference to drawings. FIG. 1 is a circuit diagram showing the configuration of an overcurrent protection apparatus for a load circuit according to the first embodiment of the invention. As shown in FIG. 1, the load circuit includes a series circuit formed by a battery VB, a MOSFET (T1) as a semiconductor element and a load RL such as a lamp or a motor. The gate (control electrode) of the MOSFET (T1) is coupled to a driver circuit 10 via a resistor R10. Thus, the MOSFET (T1) is turned on and off in response to a drive signal outputted from the driver circuit 10 to thereby switch the load RL between a driving state and a stop state.

The drain (first main electrode) (point d: voltage V1) of the MOSFET (T1) is coupled to a ground via a series circuit of a resistor R4 (for example, 112 [KΩ]) and R5 (for example, 8 [KΩ]). Further, the point d is coupled to the ground via a series circuit of a resistor R1 (for example, 5 [KΩ]), a transistor T2 and a resistor R3 (for example, 100 [KΩ]). A coupling point (point a: voltage Va) between the transistor T2 and the resistor R1 is coupled to the inverting input terminal of an amplifier AMP1 (amplifying section). The non-inverting input terminal of the amplifier AMP1 is coupled to the source (second main electrode) (point c: voltage V2) of the MOSFET T1. Further, the output terminal of the amplifier AMP1 is coupled to the gate of the transistor T2. Numerals shown beneath the respective resistors in the figure show examples of concrete resistance values thereof, respectively.

Further, a coupling point (point e: voltage V3) between the transistor T2 and the resistor R3 is coupled to the inverting input terminal of a comparator CMP1 and a coupling point (point f: voltage V4) between the resistors R4 and R5 is coupled to the non-inverting input terminal of the comparator CMP1

Further, the point d is grounded via a series circuit of a resistor R7 (for example, 12.5 [KΩ]), a transistor T3 and a transistor T4. The gate of the transistor T3 is coupled to the output terminal of the amplifier AMP1. The drain and the gate of the transistor T4 are coupled (short circuited) and this coupling point is coupled to both the gate of a transistor T5 and the drain of the transistor T3. Further, the drain of the transistor T5 is coupled to the point a and the source thereof is grounded. Thus, the transistors T4 and T5 constitute a current mirror circuit.

Further, the point d is grounded via a series circuit of a resistor R9 (for example, 500 [KΩ]) and a transistor T7. The point d is also coupled to the point a via a series circuit of a resistor R8 (for example, 12.5 [KΩ]) and a transistor T6. The drain of the transistor 7 is coupled to the gate of the transistor T6.

Next, the explanation will be made as to the operation of the overcurrent protection apparatus according to the first embodiment. First, as the basic operation, the explanation will be made as to the operation in the case where the deviation ΔRon of the on-resistance Ron of the MOSFET (T1) is zero (ΔRon=0). When the MOSFET (T1) is turned on by the drive signal outputted from the driver circuit 10, a load current ID flows to drive the load RL. In this case, the amplifier AMP1 and the transistor T2 operate so as to control a current I1 in a manner that the drain-source voltage Vds of the MOSFET (T1) coincides with a voltage generated across the resistor R1. Thus, the voltage V3 generated at the resistor R3 becomes a voltage (for example, a voltage of 20 times as large as the drain-source voltage) obtained by amplifying the voltage Vds. The comparator CMP1 compares the voltage V3 with the determination voltage V4. When V3 is larger than V4, since the output signal of the comparator CMP1 is inverted to a low level from a high level, the MOSFET (T1) is interrupted by detecting the inverted output signal. Thus, the load circuit can be protected from the overcurrent.

Next, the explanation will be made as to the case where the on-resistance of the MOSFET (T1) contains the deviation ±ΔRon. The deviation ±ΔRon of the on-resistance of the MOSFET (T1) represents the deviation from the average value Ron of the on-resistance and so has a negative or positive value. First, the explanation will be made as to a method of correcting the variance of the detected current value in the case where the deviation ±ΔRon has a positive value.

When ΔRon is larger than 0, the current I1 flowing through the resistor R1 increases as compared with the case where the on-resistance is the average value Ron. Supposing that the increased amount is ΔI1 and a drain current of the MOSFET (T1) is ID, the current I1 is expressed by the following expression (5).

$$I1 = (Ron + \Delta Ron) * ID / R1 \qquad (5)$$
$$= Ron * ID / R1 + \Delta Ron * ID / R1$$
$$= Ron * ID / R1 + \Delta I1$$

Thus, the following expression (6) is obtained.

$$\Delta I1 = \Delta Ron * ID / R1 \qquad (6)$$

In order to remove the influence of ΔRon (>0), a current I3 flowing through the resistor R3 is required to be a current (I1−ΔI1) obtained by subtracting the change value ΔI1 from the current I1. From the expression (6), it will be understood that the change value ΔI1 is proportional to the current ID. Thus, the change value ΔI1 is also proportional to the current I1.

According to the embodiment, the circuit is configured in a manner that supposing that the maximum value of the deviation ΔRon from the average on-resistance Ron is ΔRonmax and the change value ΔI1 corresponding to ΔRonmax is represented as ΔI1 max, a reference current of which value is larger than ΔI1max is created, then the change value ΔI1 is generated by reducing the value of the reference current and the change value ΔI1 thus generated is subtracted from the current I1. In other words, when the deviation ΔRon (>0) is contained in the on-resistance of the MOSFET (T1), the current I1 flowing through the resistor R1 does not reflect the load current ID due to the influence of the deviation ΔRon. Thus, the current I3 obtained by subtracting the change value ΔI1 generated due to the deviation ΔRon from the current I1 flows through the resistor R3. In this case, since the current I3 reflects the load current ID, the detection can be performed accurately when the load current ID becomes an overcurrent state.

According to the embodiment, the series circuit of the resistor R7, transistor T3 (P-type MOSFET) and transistor T4 (N-type MOSFET) is disposed between the power source V1 (point d) and the ground. The current flowing through a path from the point d to the GND (ground) via R7, T3 and T4 is supposed to be I4 and the value of the resistor R7 is set so that I4 is larger than ΔI1max. Thus, the resistor R7 is set so as to satisfy the following expression (7).

$$R7 < R1 * (I1/\Delta I1max) \qquad (7)$$

For example, if ΔI1max/I1 is 0.3, the value of the resistor R7 is required to be set to be equal to or smaller than (3.3*R1).

Further, the channel width of the transistor T3 is set so as to satisfy the following expression (8) so that the source voltage of the transistor T3 becomes same as the source voltage of the transistor T2.

$$(\text{Channel width of } T3) = (\text{channel width of } T2) * R1/R7 \qquad (8)$$

When the channel width of the transistor T3 is set as represented by the expression (8), the source voltage of the transistor T3 becomes same as the source voltage Va of the transistor T2, and hence the following expression (9) is satisfied.

$$I4 = R1 * I1 / R7 \qquad (9)$$

From the aforesaid matter, the current I4 larger than the current ΔImax flows through the resistor R7.

Next, the explanation will be made as to a procedure of generating the change value ΔI1 of the current and subtracting the change value ΔI1 from the current I1. In this embodiment, the current I4 is generated, then a current I5 brunched from the current I1 is generated by using the current mirror circuit configured by the transistor T4 and the transistor T5 (N-type MOSFET) and the current I5 is set so as to be equal to the change value ΔI1. Hereinafter, the detailed explanation thereof will be made.

As shown in FIG. 1, the gate of the transistor T5 is coupled to the gate of the transistor T4, the source thereof is grounded and the drain thereof is coupled to the point a.

The current I5 flowing through the transistor T5 is the change value ΔI1 of the current to be corrected and the channel width ratio α of the current mirror is controlled so as to satisfy the following expression (10).

$$\Delta I1 = I5 = \alpha * I4 \qquad (10)$$

The channel width ratio α is a ratio between the channel width of the transistor T4 and the channel width of the transistor T5 and is represented by α=(channel width of T5)/(channel width of T4).

The method of controlling the channel width ratio α is performed in a manner that the transistor T5 is configured by a plurality of NMOSs disposed in parallel, and the composed channel width of the transistor T5 is controlled by controlling the number of the NMOSs to be placed in an ON state. When all the NMOSs constituting the transistor T5 are in an OFF state, α becomes zero. When the number of the NMOSs to be placed in the ON state is increased and the total of the channel widths thereof becomes same as the channel width of the transistor T4, α becomes 1.

As to α in a range of 0<α<1, it is coped by adjusting the number of the NMOSs to be placed in the ON state. The more the number of the NMOSs to be disposed in parallel is, the more the resolution is improved, so that the channel width ratio α determined by the composite channel width can be changed finely. It is also possible to set the channel width ratio α so as to be 1 or more in the expression (10). Since usually the deviations ±ΔRon of the on-resistances of the MOSFETs (T1) have inherent values depending on individual MOSFETs to be used, when the channel width ratio α is determined once, this value α can be used permanently. Hereinafter, the actual correcting method will be explained.

First, an overcurrent determination value IDS is obtained by using the overcurrent determination voltage V4 (voltage at the point f), the amplification factor m (R3/R1) and the average value Ron of the on-resistance of the MOSFET (T1).

The overcurrent determination value IDS is a current value (interruption current) for determining that the current flowing into the load RL is an overcurrent. It is determined that the operation is normal if the output signal of the comparator CMP1 is inverted when the load current ID increases gradually and reaches the overcurrent determination value IDS. When the voltage V3 at the point e shown in FIG. 1 exceeds the determination voltage V4, since the output signal of the comparator CMP1 is inverted, the following expression (11) is obtained.

$$IDS = V4/m/Ron \qquad (11)$$

Its is supposed that a current of which value is equal to the overcurrent determination value IDS obtained from the expression (11) is flown into the MOSFET (T1). In this case, if α is set to 0, (Ron+ΔRon) becomes larger than Ron in the case of "ΔRon>0". Thus, since V3 becomes lager than V4, the output signal of the comparator CMP1 becomes the low level. In this state, when the channel width ratio α is increased gradually from 0, the current I5 flowing through the transistor T5 increases gradually. Since the current I3 flowing through the resistor R3 satisfies the expression of I3=I1−I5, the voltage V3 reduces gradually and finally the output signal of the comparator CMP1 is inverted into the high level from the low level. The channel width ratio α at this time is set as the correction value. When the current I5 is generated by using this channel width ratio α, the current change amount ΔI1 necessary for correcting the variance of the detection current value caused by the presence of the deviation ΔRon (>0) can be subtracted from the current I1 flowing through the resistor R1. That is, it becomes possible to flow a current I1−ΔI1 (=I3) into the resistor R3.

A method of holding the channel width ratio α to a particular value is performed in a manner that an EEPROM or a flash memory is assembled within an IC and the channel width ratio α is stored therein. When the IC is operated, a logic circuit reads the channel width ratio α from the memory and turns on a predetermined number of the NMOSs corresponding to the α among the plurality of NMOSs constituting the transistor T5 to thereby generate the current I5. As described above, the explanation is made as to the method of correcting the current I1 in the case where the deviation ΔRon has a positive value (ΔRon>0).

Next, the explanation will be made as to the method of correcting the current I1 in the case where the deviation ΔRon has a negative value (ΔRon<0). In the case of ΔRon<0, the current flowing into the resistor R1 becomes smaller than the current in the case where the on-resistance of the MOSFET (T1) is the average value Ron. An amount of the reduction of the current at this time is supposed to be −ΔI1.

In this case, since the current flowing through the resistor R3 becomes smaller than the current in the case of ΔRon=0, the voltage V3 becomes lower relatively, whereby the load current ID by which the output signal of the comparator CMP1 is inverted into the low level from the high level becomes large. That is, the detection current value (current value at the time of interrupting T1) varies toward a larger value. In order to correct this variance, it is sufficient to add the reduction value (−ΔI1) of the current I1 to the current I3 flowing through the resistor R3.

This correction can not be realized only by the aforesaid correction circuit (correction circuit in the case of ΔRon>0). Thus, in this embodiment, as shown in FIG. 1, the resistors R8, R9 and the transistors T6, T7 are provided.

When the drive voltage is supplied to the gate (terminal G7) of the transistor T7 shown in FIG. 1 to thereby turn the transistor T7 on, since the gate of the transistor T6 is grounded, the transistor T6 is turned on and so a current I6 flows from the point d to the point a via R8 and T6. The value of the resistor R8 is set so that I6 becomes substantially same as I4.

Since the current I6 is added, the current I3 flowing through the resistor R3 is represented by the following expression (12).

$$I3=I1-I5+I6 \quad (12)$$

Supposing that I5 is 0, that is, α is 0, the current I3 becomes a current (I1+I6) obtained by adding the current I6 to the current I1. Further, like the aforesaid case of ΔRon>0, when the channel width ratio α is controlled to increase the current I5, the current I3 (=I1+I6) is reduced. That is, the current I3 becomes a current (I1−I5+I6) obtained by adding I6−I5 to the current I1. Thus, when I6 becomes the same as I5, since the current to be added becomes zero, the current I3 becomes equal to the current I1. In other words, the current I3 corrected as to the variance of the current I1 caused by the deviation ΔRon (<0) can be generated by generating the current I6 proportional to the load current ID, then adding the current I6 to the current I1, then adjusting the current I5 and subtracting this current I5 thus adjusted from the sum of the current I1 and the current I6.

In this manner, according to the overcurrent protection apparatus of the first embodiment, the current I3 flowing through the resistor R3 is formed so as not to be influenced by the deviation ±ΔRon in a manner that the change value ΔI1 of the current I1 generated due to the presence of the deviation ±ΔRon of the on-resistance is generated and the change value ΔI1 is subtracted from or added to the current I1 flowing through the resistor R1. Thus, when the current flowing through the load circuit increases, the circuit can be interrupted surely by a predetermined overcurrent value without being influenced by the deviation ±ΔRon from the average on-resistance value Ron of the MOSFET (T1).

When the deviation ±ΔRon has a negative value, the current I3 having a value obtained substantially by adding the change value ΔI1 to the current I1 is generated in a manner that the current I6 is added to the current I1 and the current I5 is subtracted from the current (I1+I6) thus added. Thus, in each of the cases where the deviation ±ΔRon is a positive value and a negative value, the change value ΔI1 can be surely corrected and so the overcurrent can be detected accurately.

Figure 2:
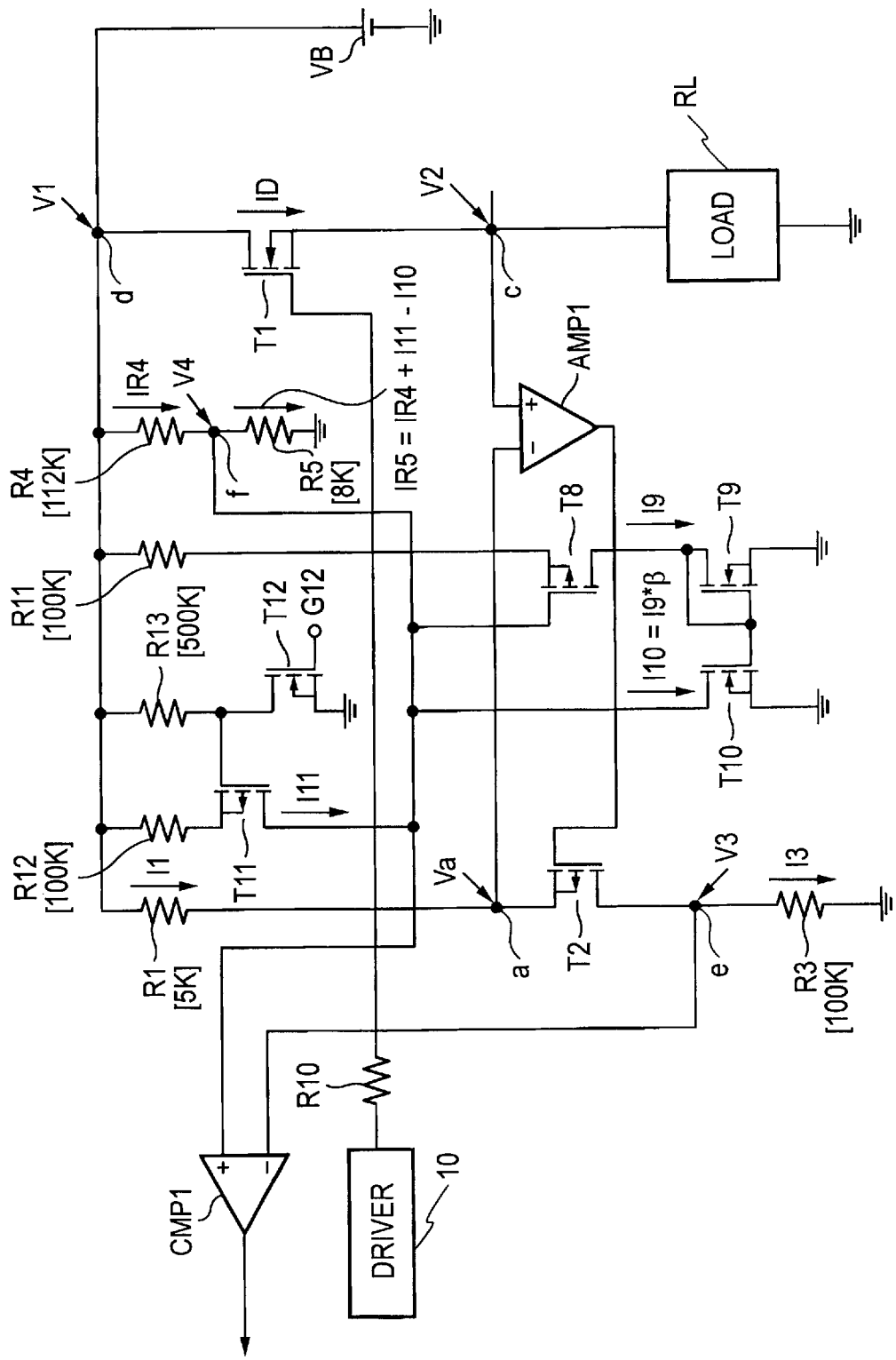
FIG. 2 is a circuit diagram showing an overcurrent protection apparatus and a load circuit according to the second embodiment of the invention.
Figure 3:
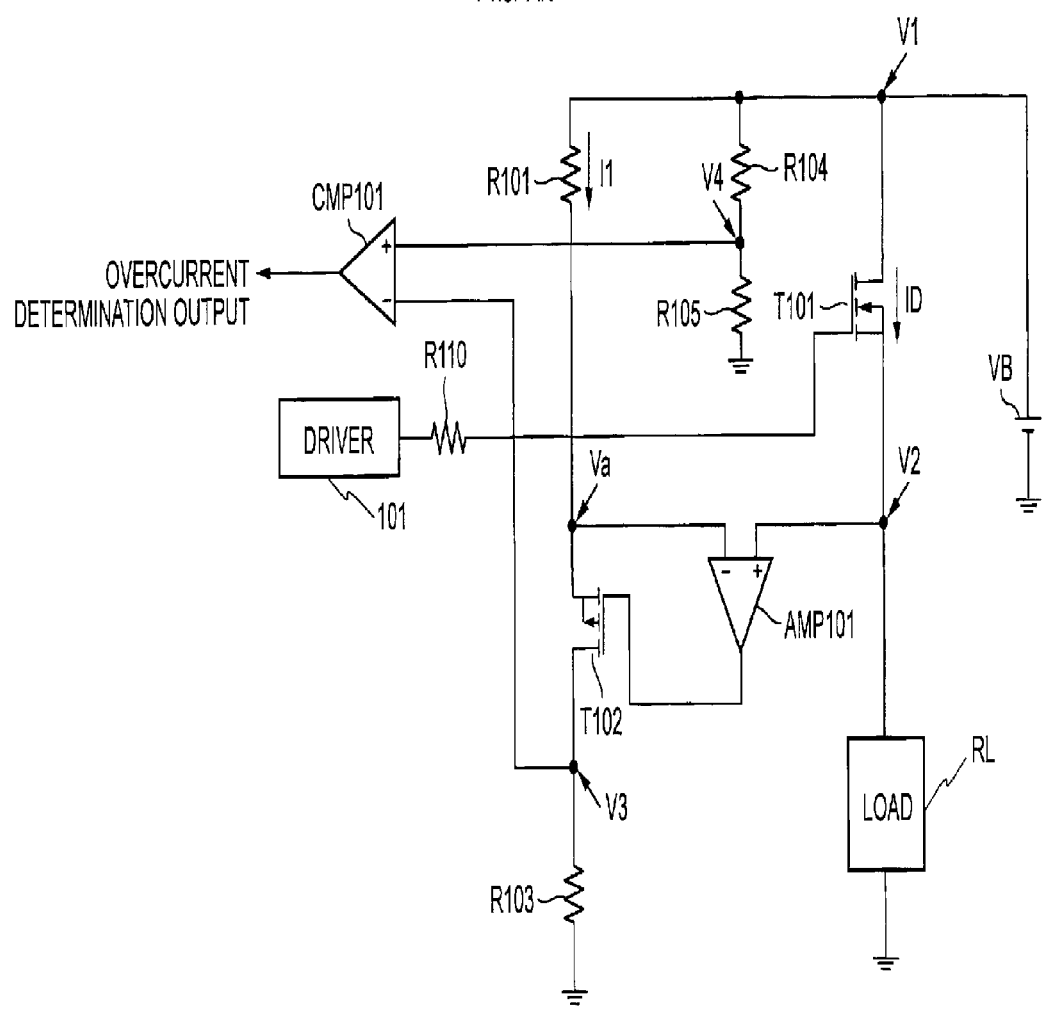
FIG. 3 is a circuit showing the configuration of an overcurrent protection apparatus and a load circuit of a related art.

Next, a second embodiment of the invention will be explained. FIG. 2 is a circuit diagram showing an overcurrent protection apparatus for a load circuit according to the second embodiment of the invention. As shown in FIG. 2, the load circuit includes a series circuit formed by the battery VB, the MOSFET (T1) as a semiconductor element and the load RL such as a lamp or a motor. The gate (control electrode) of the MOSFET (T1) is coupled to the driver circuit 10 via the resistor R10. Thus, the MOSFET (T1) is turned on and off in response to the drive signal outputted from the driver circuit 10 to thereby switch the load RL between the driving state and the stop state.

The drain (point d: voltage V1) of the MOSFET (T1) is coupled to the ground via a series circuit of the resistor R4 (for example, 112 [KΩ]) and R5 (for example, 8 [KΩ]). Further, the point d is coupled to the ground via a series circuit of the resistor R1 (for example, 5 [KΩ]), the transistor T2 and the resistor R3 (for example, 100 [KΩ]). A coupling point (point a: voltage Va) between the transistor T2 and the resistor R1 is coupled to the inverting input terminal of the amplifier AMP1 (amplifying section). The non-inverting input terminal of the amplifier AMP1 is coupled to the source (point c: voltage V2) of the MOSFET T1. Further, the output terminal of the amplifier AMP1 is coupled to the gate of the transistor T2. Numerals shown beneath the respective resistors in the figure show examples of concrete resistance values thereof, respectively.

Further, a coupling point (point e: voltage V3) between the transistor T2 and the resistor R3 is coupled to the inverting input terminal of the comparator CMP1 and a coupling point (point f: voltage V4) between the resistors R4 and R5 is coupled to the non-inverting input terminal of the comparator CMP1

Further, the point d is grounded via a series circuit of a resistor R11 (for example, 100 [KΩ]), a transistor T8 (P-type MOSFET) and a transistor T9 (N-type MOSFET). The gate of the transistor T8 is coupled to the non-inverting input terminal (point f) of the comparator CMP1. The drain and the gate of the transistor T9 are coupled to each other and a coupling point therebetween is coupled to the gate of a transistor T10 (N-type MOSFET). Further, the drain of the transistor T10 is coupled to the point f and the source thereof is grounded. Thus, the transistors T9 and T10 constitute a current mirror circuit.

Further, the point d is coupled to the point f via a series circuit of a resistor R12 (for example, 100 [KΩ]) and a transistor T11. The point d is also grounded via a series circuit of a resistor R13 (for example, 500 [KΩ]) and a transistor T12. A current flowing through a path from the point d to the GND via R11, T8 and T9 is supposed as I9 and the resistor R11 is set to a value similar to the resistor R4.

Hereinafter, the operation of the second embodiment will be explained. Since the source-gate voltage of the transistor T8 is smaller than the voltage drop of the resistor R4, the current I9 is almost proportional to a current IR4 flowing through the resistor R4.

A current I10 flowing through the transistor T10 is used for correcting the determination voltage V4 and controls the channel width ratio β so as to satisfy the following expression (13).

$$I10 = \beta * I9 \tag{13}$$

The technical concept of controlling the channel width ratio β is same as that of controlling the channel width ratio α in FIG. 1. The actual correcting method using this technical concept will be explained.

Supposing that a load current to be determining with respect to the overcurrent is IDS1, the IDS1 is flown through the MOSFET (T1). If β is set to 0 and the on-resistance is smaller than a target value due to the deviation ±ΔRon of the on-resistance or the replacement of the semiconductor element (MOSFET (T1)), V4 becomes larger than V3 so that the output of the comparator CMP1 becomes the high level. When the channel width ratio β is increased gradually from 0, since the current I10 increases in accordance with the increase of the channel width ratio, the current IR5 (IR5=IR4−I10) flowing into the resistor R5 reduces and so the voltage V4 reduces gradually. Then, the voltage V4 becomes smaller than the voltage V3, whereby the output of the comparator CMP1 is inverted from the high level to the low level. The channel width ratio β at this time is set as a correction value.

When the current I10 is generated by using this channel width ratio β, the overcurrent determination value can be corrected so as to coincide with IDS1 even if the on-resistance of the MOSFET (T1) changes to a smaller value with respect to the target value. That is, even if the on-resistance of the MOSFET (T1) changes to a smaller value with respect to the target value due to the replacement of the MOSFET (T1) or due to the negative value of the deviation ΔRon, the overcurrent determination value can be made coincide with IDS1

Next, the explanation will be made as to the correction method in the case where the on-resistance changes to a larger value with respect to the target value due to the deviation ±ΔRon of the on-resistance or the replacement of the MOSFET (T1). In this case, since the current flowing through the resistor R3 increases with respect the current value IDS1 to be determined as to the overcurrent, the voltage V3 increases relatively, whereby the load current ID at the time of inverting the output of the comparator CMP1 to the low level becomes smaller than IDS1. That is, the detection current value varies toward small values. It is required to increase the voltage V4 in order to correct this variance. To this end, it is necessary to add a current at the point f to thereby increase the current IR5 flowing into the resistor R5. Since such the increase of the current can not be realized only by the current I10, a circuit constituted by the resistors R12, R13 and the transistors T11, T12 shown in FIG. 2 is employed in this embodiment.

First, when a positive bias voltage is applied to the gate (terminal G12) of the transistor T12 to thereby turn the transistor T12 on, since the gate of the transistor T11 is grounded, the transistor T11 is turned on, whereby a current I11 flows through a path from the point d to the point f via R12 and T11. In this case, the value of the resistor R12 is set so that I11 is almost same as I9.

Due to the addition of the current I11, the current IR5 flowing through the resistor R5 is expressed by the following expression (14).

$$IR5 = IR4 - I10 + I11 \tag{14}$$

Supposing that I10 is 0, that is, β is 0, the current IR5 becomes a current (IR4+I11) which is the sum of the current IR4 and the current I11. When the channel width ratio β is controlled to increase the current I10, the current to be added to the current IR4 becomes I11−I10. When I10 becomes equal to I11, the current to be added becomes zero. In other words, the overcurrent determination value can be corrected so as to coincide with IDS1 even if the on-resistance changes to a larger value by adding the current I11−I10 proportional to the current IR4 to the current IR4 and by adjusting an amount of the current I10. This correction is performed with respect to the change of the on-resistance no matter what reason causes the change of the on-resistance such as either the deviation ±ΔRon of the on-resistance or the change of the semiconductor element (MOSFET (T1)). Therefore, even when the change of the on-resistance is caused by the replacement or the exchange of the semiconductor, this correction can be attained correctly so that the overcurrent determination value is set accurately to the desired value.

In this manner, according to the overcurrent protection apparatus of the second embodiment, the variance of the overcurrent determination value can be corrected irrespective of the reason of the change of the on-resistance, namely, whether the change is caused by the deviation ±ΔRon of the on-resistance or the change of the semiconductor element. Thus, a determination voltage circuit R4, R5 can be disposed within an IC.

That is, normally, in the case of manufacturing the load circuit and the overcurrent protection apparatus such as shown in FIGS. 1 and 2, the constituent elements other than the MOSFET (T1) and the resistors R4, R5 for generating the determination voltage are incorporated into a single IC. The MOSFET (T1) is disposed outside of the IC so as to cope with the change of the kind of the MOSFET (T1). The resistors R4, R5 are disposed outside of the IC because it is necessary to change the overcurrent determination value (voltage V4) in accordance with the change of the kind of the MOSFET (T1). That is, when the kind of the semiconductor element is changed, the on-resistance changes in general and also a current value to be determined as the overcurrent changes, so that the drain-source voltage Vds at the time of determining the overcurrent changes. Thus, since it is necessary to change the determination voltage (V4), R4 and R5 are not provided within the IC but disposed outside of the IC.

In contrast, according to the overcurrent protection apparatus of the second embodiment, the apparatus is configured to change the determination voltage V4 so that the output signal of the comparator CMP1 is inverted when a current determined as the overcurrent flows through the load RL. Thus, since it becomes possible to provide the resistors R4, R5 within the IC, the circuit configuration can be simplified, whereby the space and the cost of the apparatus can be reduced.

As described above, although the overcurrent protection apparatus for a load according to the invention is explained based on the embodiments shown in the figures, the invention is not limited thereto and the configurations of the respective portions can be replaced by arbitrary configurations having the similar functions.

For example, although, in the aforesaid embodiment, the MOSFET (T1) is used as an example of the semiconductor element, the invention is not limited thereto and another semiconductor element may be employed therefore.

Although the invention has been explained with reference to the particular embodiments, it will be apparent for those skilled in the art that various changes and modifications may be made without departing from the spirit and scope of the invention.

The present application is based on Japanese Patent Application (Japanese Patent Application No. 2008-148344) filed on Jun. 5, 2008, the content of which is incorporated by reference.

INDUSTRIAL APPLICABILITY

The invention is quite useful in order to surely protect the load circuit from the overcurrent even in the case where the on-resistance of the semiconductor element has a deviation.

EXPLANATION OF SYMBOLS

| 10 | driver circuit |
|---|---|
| VB | battery (power source) |
| RL | load |
| CMP1 | comparator |
| AMP1 | amplifier (amplifying section) |
| T1 | MOSFET (first semiconductor element) |

The invention claimed is:

1. An overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:

an amplifying section (AMP1) that includes a non-inverting terminal which is coupled to the second main electrode of the first semiconductor element (T1);

a first resistor (R1) that includes one end which is coupled to the first main electrode of the first semiconductor element (T1) and the other end which is coupled to an inverting terminal of the amplifying section (AMP1);

a third resistor (R3);

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and a comparator (CMP1) that includes one input terminal and the other input terminal, the one input terminal being applied with a voltage (V3) at a coupling point (point e) between the second semiconductor element (T2) and the third resistor (R3), and the other input terminal being applied with a determination voltage (V4) which is generated by dividing a voltage (V1) of the first main electrode of the first semiconductor element (T1) by a resistance ratio (R4:R5), wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is larger than the average value (Ron) of the on-resistance, a current obtained by subtracting a current (ΔI1) proportional to a deviation (ΔRon) of the on-resistance from a current (I1) flowing through the first resistor at the point a is flown through the third resistor so that an output signal of the comparator (CMP1) is inverted.

2. An overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:

an amplifying section (AMP1) that includes a non-inverting terminal which is coupled to the second main electrode of the first semiconductor element (T1);

a first resistor (R1) that includes one end which is coupled to the first main electrode of the first semiconductor element (T1) and the other end which is coupled to an inverting terminal of the amplifying section (AMP1);

a third resistor (R3);

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and a comparator (CMP1) that includes one input terminal and the other input terminal, the one input terminal being applied with a voltage (V3) at a coupling point (point e) between the second semiconductor element (T2) and the third resistor (R3), and the other input terminal being applied with a determination voltage (V4) which is generated by dividing a voltage (V1) of the first main electrode of the first semiconductor element (T1) by a resistance ratio (R4:R5), wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is smaller than the average value (Ron) of the on-resistance, a current obtained by adding a current (ΔI1) proportional to a deviation (ΔRon) of the on-resistance to a current (I1) flowing through the first resistor at the point a is flown through the third resistor so that an output signal of the comparator (CMP1) is inverted.

3. The overcurrent protection apparatus according to claim 1, further comprising:
a seventh resistor (R7) that includes one end which is coupled to the positive electrode terminal (point d) of the power source;
a third semiconductor element (T3) that includes a second main electrode which is coupled to the other end of the seventh resistor (R7) and a control electrode which is coupled to the output terminal of the amplifying section (AMP1); and
a fourth semiconductor element (T4) that includes a first main electrode and a control electrode which are coupled to a first main electrode of the third semiconductor element and a second electrode which is grounded,
wherein when the on-resistance of the first semiconductor element (T1) is larger than the average value of the on-resistance, a current (I4) proportional to a current (ID) flowing into the first semiconductor element is generated, and a current (ΔI1 (=I5)) proportional to the deviation is generated by using the current (I4).

4. The overcurrent protection apparatus according to claim 2, further comprising:
a seventh resistor (R7) that includes one end which is coupled to the positive electrode terminal (point d) of the power source;
an eighth resistor (R8) that includes one end which is coupled to the point d;
a third semiconductor element (T3) that includes a second main electrode which is coupled to the other end of the seventh resistor (R7) and a control electrode which is coupled to an output terminal of the amplifying section (AMP1);
a fourth semiconductor element (T4) that includes a first main electrode and a control electrode which are coupled to a first main electrode of the third semiconductor element and a second electrode which is grounded; and
a sixth semiconductor element (T6) that couples the other end of the eighth resistor (R8) and the point a,
wherein when the on-resistance of the first semiconductor element (T1) is smaller than the average value (Ron) of the on-resistance, the sixth semiconductor element (T6) is controlled so as to be turned on, and a current (I1+I6−I5) obtained by adding a current (I6−I5), which is obtained by subtracting a current (I5) proportional to a current (I4) flowing through the fourth semiconductor element (T4) from a current (I6) flowing through the eighth resistor (R8), to the current (I1) flowing through the first resistor is flown into the third resistor.

5. An overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:
an amplifying section (AMP1) that includes a non-inverting terminal which is coupled to the second main electrode of the first semiconductor element (T1);
a first resistor (R1) that includes one end which is coupled to the first main electrode of the first semiconductor element (T1) and the other end which is coupled to an inverting terminal of the amplifying section (AMP1);
a third resistor (R3);
a forth resistor (R4) that includes one end which is coupled to a terminal (point d) of the power source;
a fifth resistor (R5) that includes one end which is coupled to the other end of the fourth resistor and the other end which is grounded;
a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and
a comparator (CMP1) that includes one input terminal and the other input terminal, the one input terminal being applied with a voltage (V3) at a coupling point (point e) between the second semiconductor element (T2) and the third resistor (R3), and the other input terminal being applied as a determination voltage with a voltage (V4) at a point f which is a coupling point between the fourth resistor and the fifth resistor,
wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is smaller than the average value (Ron) of the on-resistance, a current (IR4−I10) obtained by subtracting a current (I10) proportional to a deviation (ΔRon) of the on-resistance from a current (IR4) flowing through the fourth resistor (R4) at the point f is flown through the fifth resistor (R5) so that an output signal of the comparator (CMP1) is inverted.

6. An overcurrent protection apparatus for protecting a load circuit from an overcurrent, the load circuit including a power source, a load and a first semiconductor element (T1) disposed between the power source and the load, a first main electrode of the first semiconductor element (T1) being coupled to a positive electrode terminal of the power source and a second main electrode of the first semiconductor element (T1) being coupled to a negative electrode terminal of the power source via the load, the overcurrent protection apparatus comprising:
an amplifying section (AMP1) that includes a non-inverting terminal which is coupled to the second main electrode of the first semiconductor element (T1);
a first resistor (R1) that includes one end which is coupled to the first main electrode of the first semiconductor element (T1) and the other end which is coupled to an inverting terminal of the amplifying section (AMP1);
a third resistor (R3);
a forth resistor (R4) that includes one end which is coupled to a terminal (point d) of the power source;

a fifth resistor (R5) that includes one end which is coupled to the other end of the fourth resistor and the other end which is grounded;

a second semiconductor element (T2) that includes a first main electrode, a second main electrode and a control electrode, the first main electrode being grounded via the third resistor (R3), the second main electrode being coupled to a point a which is a coupling point between the first resistor (R1) and the inverting terminal of the amplifying section, and the control electrode being coupled to an output terminal of the amplifying section; and a comparator (CMP1) that includes one input terminal and the other input terminal, the one input terminal being applied with a voltage (V3) at a coupling point (point e) between the second semiconductor element (T2) and the third resistor (R3), and the other input terminal being applied as a determination voltage with a voltage (V4) at a point f which is a coupling point between the fourth resistor and the fifth resistor, wherein in a case where a current having a current value (V4/m/Ron), which is obtained by dividing the determination voltage (V4) by a value (m) that is obtained by dividing a resistance value of the third resistor (R3) by a resistance value of the first resistor (R1), by an average value (Ron) of an on-resistance of the first semiconductor element (T1) flows into the first semiconductor element (T1) and the on-resistance is larger than the average value (Ron) of the on-resistance, a current (IR4+I11−I10) obtained by adding a current (I11−I10) proportional to a deviation (ΔRon) of the on-resistance to a current flowing through the fourth resistor (R4) at the point f is flown through the fifth resistor (R5) so that an output signal of the comparator (CMP1) is inverted.

7. The overcurrent protection apparatus according to claim 5, further comprising:

an eleventh resistor (R11) that includes one end which is coupled to an output terminal (point d) of the power source;

an eighth semiconductor element (T8) that includes a second main electrode which is coupled to the other end of the eleventh resistor (R11) and a control electrode which is coupled to the point f; and a ninth semiconductor element (T9) that includes a first main electrode and a control electrode which are coupled to a first main electrode of the eighth semiconductor element and a second electrode which is grounded, wherein when the on-resistance of the first semiconductor element (T1) is smaller than the average value (Ron) of the on-resistance, a current (I9) proportional to a current (IR4) flowing into the fourth resistor (R4) is generated, and a current (I10) proportional to the deviation (ΔRon) is generated by using the current (I9).

8. The overcurrent protection apparatus according to claim 6, further comprising:

an eleventh resistor (R11) that includes one end which is coupled to an output terminal (point d) of the power source;

a twelfth resistor (R12) that includes one end which is coupled to the output terminal (point d) of the power source;

an eighth semiconductor element (T8) that includes a second main electrode which is coupled to the other end of the eleventh resistor (R11) and a control electrode which is coupled to the point f;

a ninth semiconductor element (T9) that includes a first main electrode and a control electrode which are coupled to a first main electrode of the eighth semiconductor element and a second electrode which is grounded; and an eleventh semiconductor element (T11) that couples the other end of the twelfth resistor (R12) and the point f, wherein when the on-resistance of the first semiconductor element (T1) is larger than the average value (Ron) of the on-resistance, the eleventh semiconductor element is controlled so as to be turned on, and the current (I11−I10) is generated by subtracting a current (I10) flowing through a tenth semiconductor element (T10) from a current (I11) flowing through the twelfth resistor (R12).

9. An overcurrent protection apparatus for protecting a load circuit from an overcurrent, the load circuit being arranged in that a first semiconductor element (T1) is disposed between a power source and a load, a first main electrode of the first semiconductor element (T1) is coupled to a positive electrode terminal of the power source and a second main electrode of the first semiconductor element (T1) is coupled to a negative electrode terminal of the power source via the load, wherein a voltage between the first main electrode and the second main electrode of the first semiconductor element (T1) is compared with a determination voltage to determine whether or not a current flowing through the first semiconductor element (T1) is an overcurrent;

the determination voltage is generated by dividing a voltage between the first main electrode of the first semiconductor element (T1) and a ground by a fourth resistor (R4) and a fifth resistor (R5);

a circuit which detects the voltage between the first main electrode and the second main electrode of the first semiconductor element (T1), a circuit which generates the determination voltage, and a comparator (CMP1) which compares the voltage between the first main electrode and the second main electrode of the first semiconductor element (T1) with the determination voltage are contained in a same integrated circuit; and in a case where an output of the comparator (CMP1) is not inverted when a current to be determined as an overcurrent is flown through the first semiconductor element (T1), the determination voltage is corrected so that the output of the comparator (CMP1) is inverted by increasing or decreasing a current flowing through the fourth resistor (R4) or the fifth resistor (R5) of a determination value circuit by a deviation current (ΔI1) corresponding to a deviation resistance (ΔRon) across the first semiconductor element (T1).

* * * * *